(12) United States Patent
Kim et al.

(10) Patent No.: US 8,144,300 B2
(45) Date of Patent: Mar. 27, 2012

(54) PRINTED CIRCUIT BOARD AND DISPLAY DEVICE USING THE SAME

(75) Inventors: Kyoung-Soo Kim, Suwon-si (KR); Jin-Ho Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 821 days.

(21) Appl. No.: 12/197,524

(22) Filed: Aug. 25, 2008

(65) Prior Publication Data

US 2008/0316415 A1 Dec. 25, 2008

Related U.S. Application Data

(62) Division of application No. 11/181,097, filed on Jul. 14, 2005, now Pat. No. 7,432,450.

(30) Foreign Application Priority Data

Jul. 23, 2004 (KR) .................. 10-2004-0057669

(51) Int. Cl.
*G02F 1/1345* (2006.01)

(52) U.S. Cl. ......... 349/150; 174/250; 174/255; 361/748

(58) Field of Classification Search ............ None
See application file for complete search history.

(56) References Cited

U.S. PATENT DOCUMENTS

| | | | |
|---|---|---|---|
| 4,694,120 A | 9/1987 | Accou | |
| 5,473,119 A | 12/1995 | Rosenmayer et al. | |
| 5,574,311 A | 11/1996 | Matsuda | |
| 5,597,643 A * | 1/1997 | Weber | 428/209 |
| 6,492,008 B1 | 12/2002 | Amagi et al. | |
| 6,519,020 B1 * | 2/2003 | Cha et al. | 349/150 |
| 6,747,216 B2 | 6/2004 | Brist et al. | |
| 7,038,917 B2 * | 5/2006 | Vinciarelli et al. | 361/778 |
| 2002/0084995 A1 | 7/2002 | Chung | |
| 2004/0085279 A1 * | 5/2004 | Kim et al. | 345/92 |
| 2009/0009706 A1 * | 1/2009 | Kim et al. | 349/149 |

FOREIGN PATENT DOCUMENTS

| | | |
|---|---|---|
| CN | 1404353 A | 3/2003 |
| JP | 02-237142 A | 9/1990 |
| JP | 06-120658 A | 4/1994 |
| JP | 07-321434 A | 12/1995 |
| JP | 07326867 A | 12/1995 |
| JP | 08320498 | 12/1996 |
| JP | 10-022635 A | 1/1998 |
| JP | 10190236 A | 7/1998 |
| JP | 11017299 | 1/1999 |
| JP | 11-040293 A | 2/1999 |
| JP | 2000056700 | 2/2000 |
| JP | 2001135746 A | 5/2001 |
| JP | 2002214636 | 7/2002 |

(Continued)

*Primary Examiner* — Thanh-Nhan Nguyen
(74) *Attorney, Agent, or Firm* — Cantor Colburn LLP

(57) ABSTRACT

A printed circuit board on which a connector is mounted includes a conductive layer, insulating layers, and a supporting member. A part of the conductive layer is exposed on a top surface of the PCB in order to form a connecting pad portion for connecting the connector. The insulating layers are disposed proximate to both sides of the conductive layer. The supporting member is connected to the conductive layer and covers a surface of a hole formed by opening an orifice through the conductive layer and the insulating layer. The hole is disposed adjacent to the connecting pad portion.

10 Claims, 9 Drawing Sheets

FOREIGN PATENT DOCUMENTS

| | | |
|---|---|---|
| JP | 2002252437 | 9/2002 |
| JP | 2003-197676 A | 7/2003 |
| JP | 2003-198113 A | 7/2003 |
| JP | 2004020825 | 1/2004 |
| JR | 2001005020 | 1/2001 |
| KR | 101998025774 | 7/1998 |
| KR | 1019990030974 | 5/1999 |
| KR | 1019990069602 | 9/1999 |
| KR | 1020030032736 | 4/2003 |
| KR | 100412106 | 12/2003 |

* cited by examiner

PRINTED CIRCUIT BOARD AND DISPLAY DEVICE USING THE SAME

This application is a divisional application of U.S. patent application Ser. No. 11/181,097 filed Jul. 14, 2005, which claims priority to Korean Patent Application No. 2004-0057669 filed in the Korean Intellectual Property Office on Jul. 23, 2004, and all the benefits accruing therefrom under 35 U.S.C. §119, and the contents of which in its entirety are herein incorporated by reference.

BACKGROUND OF THE INVENTION (a) Field of the Invention

The present invention relates to a printed circuit board (PCB) and a display device using the same, and more particularly, to a PCB having excellent exfoliation resistance of embedded contact pad portions and a display device using the same.

(b) Description of Related Art

Recently, with rapid development of semiconductor technology, a demand for small-sized and low weight flat panel display devices having improved performance has explosively increased.

Among the flat panel display devices, a liquid crystal display (LCD) device has advantages of small size, low weight, and low power consumption. Therefore, much attention has been paid to the LCD device as an alternative to existing cathode ray tube (CRT) display devices. As a result, LCD devices are widely used for almost all information processing apparatuses requiring display devices.

In a typical LCD device, a specific molecular alignment of liquid crystal cells in a liquid crystal layer is changed into another molecular alignment by applying a voltage across the liquid crystal layer. Changes in magnitude of the voltage that is applied across the liquid crystal layer cause a change of optical characteristics of the liquid crystal cells, such as birefringence, optical rotary power, dichroism, optical scattering, etc., which are converted into a visual change. In other words, a typical LCD device is a light-receiving type of display device, which displays information using optical modulation of the liquid crystal cells.

In a conventional LCD device, a PCB is electrically driven so as to display images on an LCD panel containing the liquid crystal layer and electrically connected to the PCB. The PCB is electrically connected to a control board via a connector, and a driving signal and power are supplied to the PCB through the control board. Hereinafter, the PCB and the control board will be explained in detail with reference to FIG. 9.

FIG. 9 is a schematic diagram showing a connection of a conventional PCB 900, and schematically shows the conventional PCB 900 provided with a connector 130, which is connected to a socket 132 of a control board (not shown).

In a conventional process of manufacturing the conventional PCB 900 to be used in a display device, as shown by double arrow 1 in FIG. 9, a process of attaching the socket 132 with the connector 130 and a process of detaching the socket 132 from the connector 130 are repeated in order to inspect a quality of products. In such case, since the socket 132 is strongly fixed to the connector 130 while attaching the socket 132 to the connector 130, stress due to repetition of the attaching and detaching process causes stress on the connector 130 in an upward and downward direction, as shown by arrow 2.

As a result of the stress, a connector grounding part positioned on a connecting pad 800 of the PCB 900 such as, for example, a part for supporting the connector 130, is damaged. Therefore, the connecting pad 800 may become loose and be exfoliated from the PCB 900.

In response to exfoliation of the connecting pad 800 from the PCB 900, the PCB 900 must be replaced entirely. Thus, there is a problem in that quality of a process for manufacturing a display device decreases and cost of manufacture increase due to replacement of the PCB 900.

SUMMARY OF THE INVENTION

The present invention is contrived to solve the above-mentioned problems, and the present invention provides a printed circuit board (PCB) on which a connector is mounted, which includes a conductive layer, insulating layers, and a supporting member. A part of the conductive layer is exposed on a top surface of the PCB in order to form a connecting pad portion for connecting the connector. The insulating layers are disposed proximate to both sides of the conductive layer. The supporting member is connected to the conductive layer and covers a surface of a hole formed by opening an orifice through the conductive layer and the insulating layer. The hole is disposed adjacent to the connecting pad portion.

The present invention is also contrived to provide a display device including a display panel on which images are displayed and a PCB connected to the display panel for receiving a driving signal through a connector mounted on the PCB and including a conductive layer. The conductive layer includes a connecting pad portion to which the connector is attached and an adjacent portion to which the connector is not attached. The PCB further comprises a supporting member which is connected to the connecting pad portion and covers a surface of a hole formed by opening an orifice through the PCB. The hole is adjacent to the connecting pad portion of the conductive layer.

BRIEF DESCRIPTION OF THE DRAWINGS

The above and other features and advantages of the present invention will become more apparent by describing in detail exemplary embodiments thereof with reference to the attached drawings, in which.

DETAILED DESCRIPTION OF THE INVENTION

Hereinafter, exemplary embodiments of the present invention will be described with reference to FIGS. 1 to 8. Such exemplary embodiments of the present invention are to illustrate the present invention, and are not limited thereto.

Figure 1:
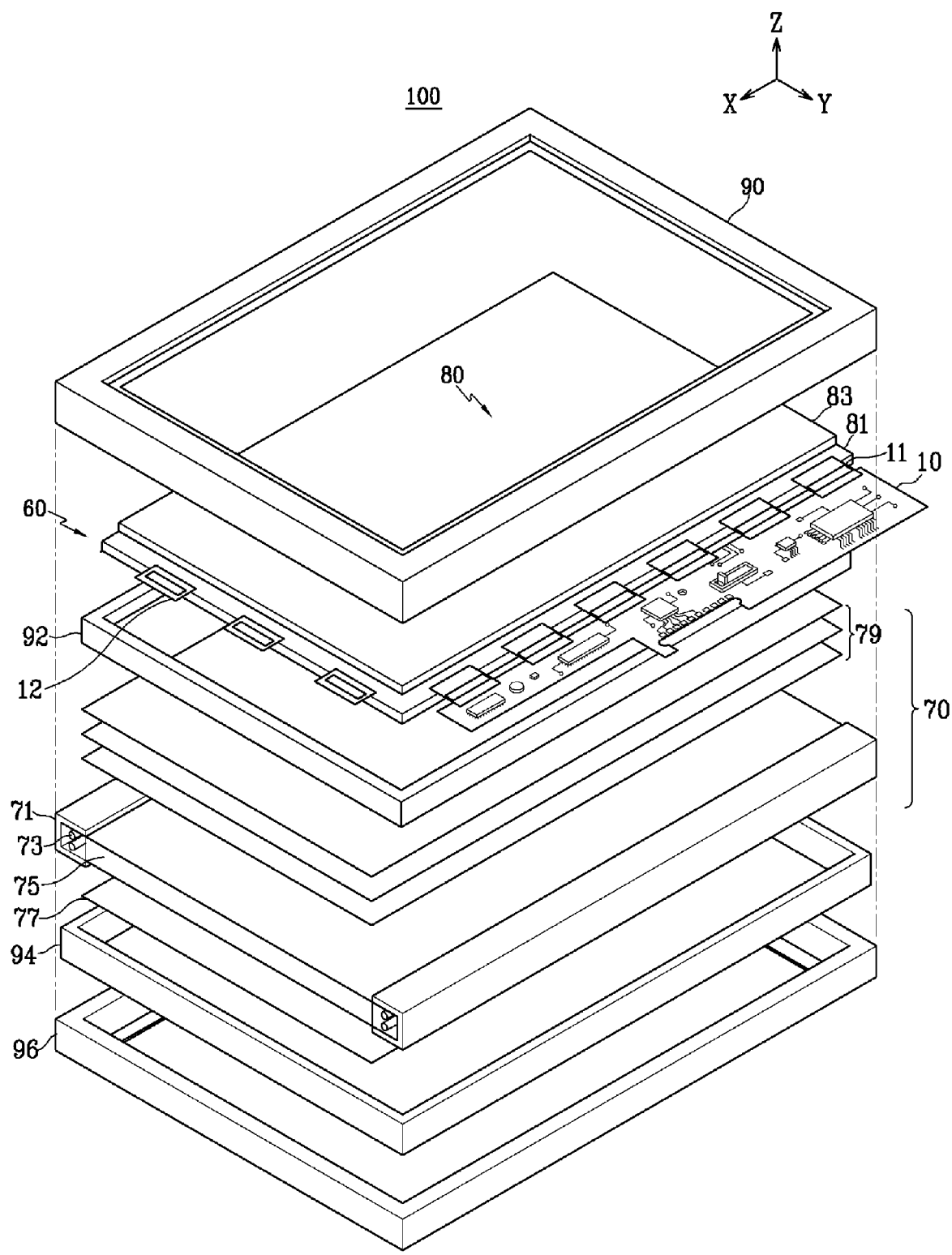
FIG. 1 is an exploded perspective view of a display device having a printed circuit board (PCB) according to an exemplary embodiment of the present invention.

FIG. 1 is an exploded perspective view of a display device having a printed circuit board (PCB) 10 according to an exemplary embodiment of the present invention. Although FIG. 1 shows a liquid crystal display (LCD) device 100, it should be noted that the LCD device is but one of representative display devices in which the present invention may be employed. The LCD device 100 shown in FIG. 1 and the structure thereof are only to illustrate an exemplary embodiment the present invention, and not to limit it. Accordingly, besides the LCD device 100 shown in FIG. 1, the present invention can also be applied to an LCD device having another structure such as a direct type and a wedge type, and to another display device such as a plasma display panel device (PDP), an organic light emitting display (OLED), and so on.

As shown in FIG. 1, the LCD device 100, which is a display device according to an exemplary embodiment of the present invention, includes a backlight assembly 70 for providing light and an LCD panel unit 80 for displaying images using light from the backlight assembly 70. In addition, in order to fix the LCD panel unit 80 on the backlight assembly 70, a top chassis 90 is used. The LCD panel unit 80 is controlled by a control board (not shown).

An LCD panel assembly 60 includes the LCD panel unit 80, a driver integrated circuit package (hereinafter referred to as a "driver IC package"), and a PCB 10. For example, the driver IC package can be a tape carrier package (TCP) or a chip on film (COF) and so on.

An LCD device, representative of a non-emissive display device, usually includes two panels. For example, the panel unit 80 includes a TFT (thin film transistor) array panel 81 including a plurality of TFTs, and a color filter panel 83 disposed opposite the TFT array panel 81. However, the panel unit 80 may include only one panel.

When the panel unit 80 has the two panels, including the TFT (thin film transistor) array panel 81 and the color filter panel 83, a liquid crystal layer (not shown) is disposed between the TFT array and color filter panels 81 and 83.

The TFT array panel 81 includes a transparent glass substrate and pixel electrodes (not shown), TFTs (not shown), and signal lines (not shown) disposed on the transparent glass substrate. The pixel electrodes are arranged in a matrix and are made of a transparent conductor such as indium tin oxide (ITO) and indium zinc oxide (IZO), or a reflective metal such as Al and Ag. The signal lines include gate lines (not shown) and data lines (not shown), and each TFT has a gate electrically connected to one of the gate lines, a source electrically connected to one of the data lines, and a drain electrically connected to one of the pixel electrodes.

The data lines and the gate lines of the TFT array panel 81 are electrically connected to the PCB 10 and they receive data signals and gate signals from the PCB 10. The TFTs turn on or turn off in response to gate signals from the gate lines to selectively transmit data signals to the pixel electrodes.

The color filter panel 83 includes color filters (not shown) facing the pixel electrodes, and a common electrode (not shown) made of, for example, a transparent conductor such as ITO or IZO that covers an entire surface of the color filter panel 83. The common electrode is supplied with a common voltage, and a voltage difference between the pixel electrode and the common electrode generates an electric field in the liquid crystal layer. The electric field determines orientations of liquid crystal molecules in the liquid crystal layer and thereby determines a transmittance of light passing through the liquid crystal layer. A data driver IC package 11 and a gate driver IC package 12 transmit control signals for controlling the LCD panel unit 80. The data driver IC package 11 is connected to the data lines disposed on the TFT array panel 81, and the gate driver IC package 12 is connected to the gate lines disposed on the TFT array panel 81. When both data and gate driver IC packages 11 and 12 are employed, as shown in FIG. 1, corresponding data and gate PCBs are also employed although FIG. 1 only shows a data PCB as the PCB 10 for clarity. Alternatively, one PCB providing control signals to both gate and data lines may be employed. In such a case, only one driver IC package, electrically connecting the one PCB to the signal lines, is necessary.

The backlight assembly 70 is disposed proximate to the LCD panel assembly 60 to provide a uniform light to the LCD panel unit 80. The backlight assembly 70 is fixed by an upper mold frame 92 and a lower mold frame 96. The backlight assembly 70 includes lamps 73 which are light sources disposed at opposite sides of the bottom chassis 94, a light guiding plate (LGP) 75 for guiding light emitted by the lamps 73 to the LCD panel unit 80, a reflecting sheet 77 which is positioned proximate to the LGP 75 in order to reflect light emitted by the lamps 73 toward the LCD panel unit 80, a lamp cover 71 which covers the lamps 73 in order to protect the lamps 73 and is coated with a reflecting material to reflect the light emitted by the lamps 73 toward the LGP 75, and optical sheets 79 for providing the LCD panel unit 80 with light having improved brightness.

The lamps 73 illustrate an exemplary light source of the present invention, and the present invention is not limited thereto. Alternative light sources to the lamps 73 include, for example, a light emitting diode (hereinafter referred to as an LED), a linear light source and a planar light source.

The PCB 10 is fixed between the top chassis 90 and the lower mold frame 96. The PCB 10 is bent to be fixed on the bottom chassis 94.

An inverter (not shown) for supplying electric power to the lamps 73 and a control board 98 (see FIG. 2A) are provided at the rear side of the bottom chassis 94. The inverter transforms an external power to a constant voltage level, and then provides the constant voltage level to the lamps 73. The control board 98 converts analog data into digital data and provides the digital data to the LCD panel unit 80. The inverter and the control board are protected by a shield case (not shown) which covers them.

The PCB 10 will now be described in detail with reference to FIGS. 1, 2A and 2B.

Figure 2A:
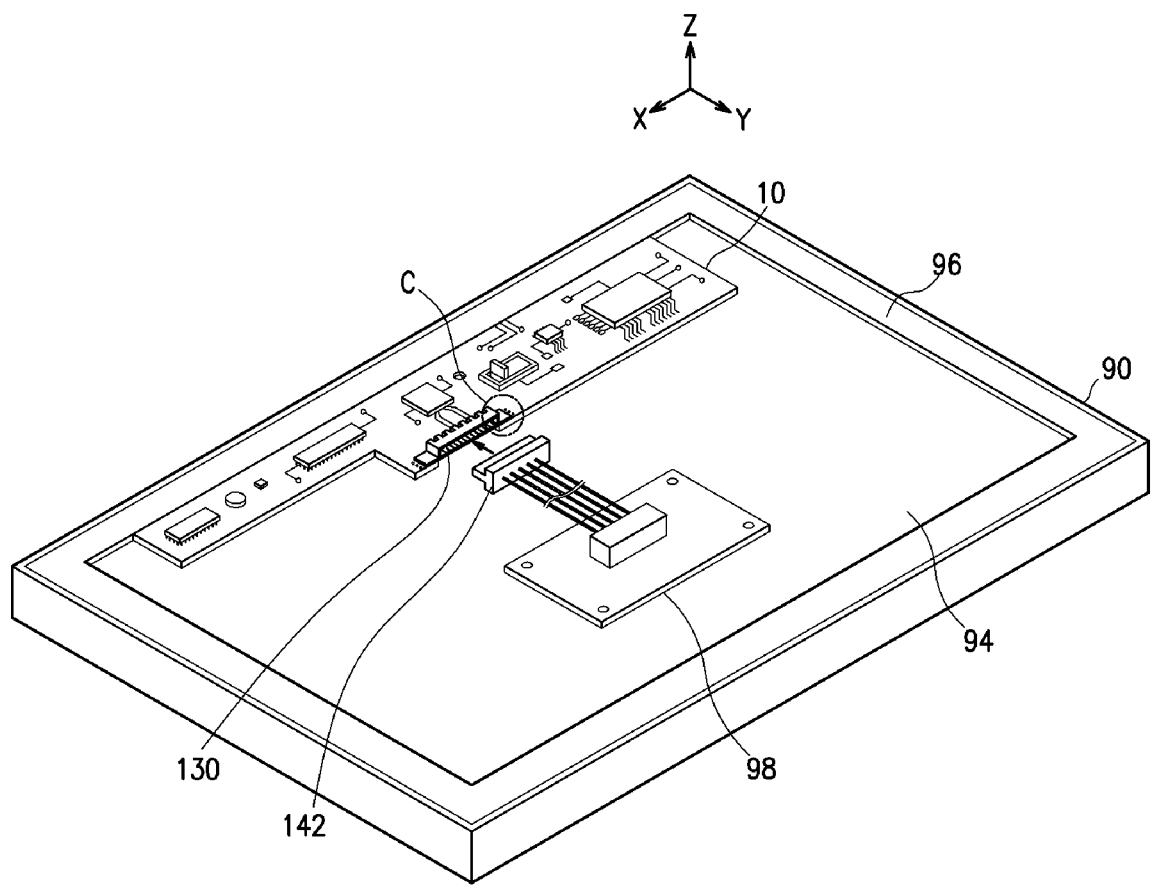
FIG. 2A is a rear perspective view of the display device of FIG. 1.

FIG. 2A is a rear side view of the LCD device 100 of FIG. 1, which is assembled and rotated by 180° about an x-axis. FIG. 2B is an enlarged rear perspective view of part "C" in FIG. 2A. The PCB 10 shown in FIG. 2 is only to illustrate an exemplary embodiment of the present invention, and the present invention is not limited thereto. Accordingly, if necessary, the present invention can be applied to another PCB.

The PCB 10 is fixed to the bottom chassis 94, and is connected to the control board 98 for signal conversion, as shown with an arrow. The PCB 10 is connected to the LCD panel unit 80 (shown in FIG. 1) to drive the LCD panel unit 80, and receives driving signals from the control board 98 via a connector 130.

Figure 2B:
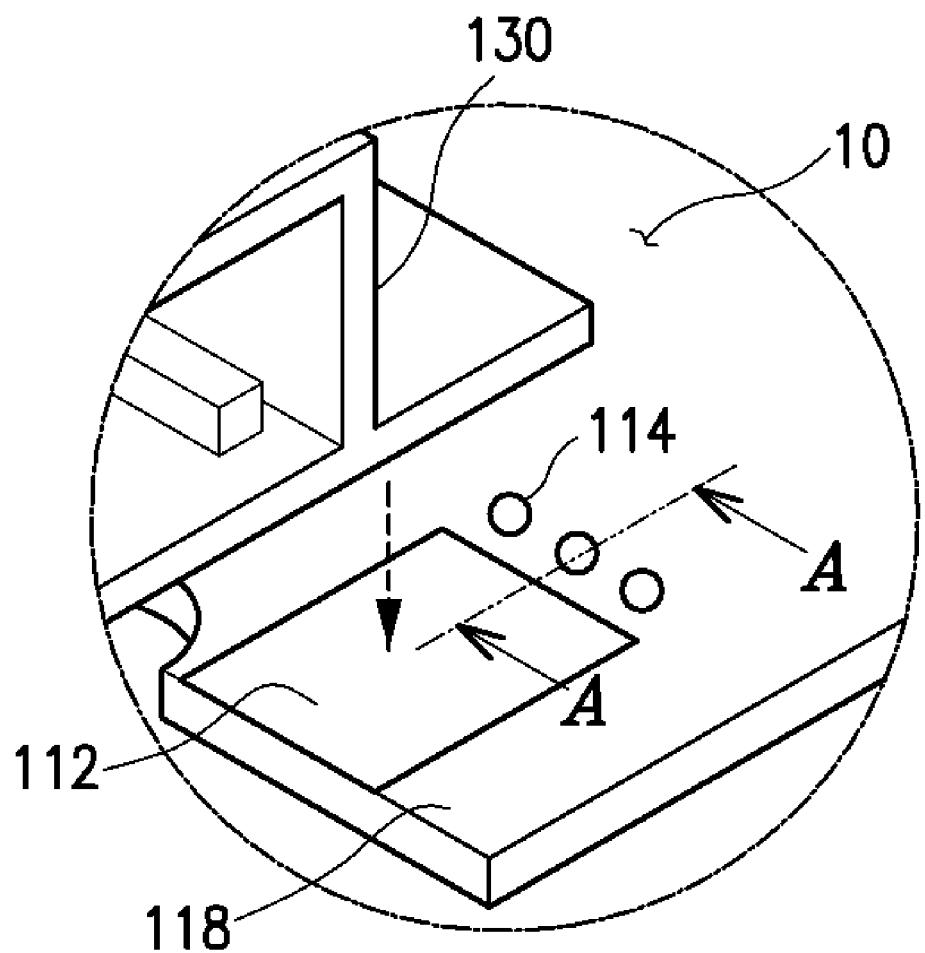
FIG. 2B is an enlarged rear perspective view of portion "C" in FIG. 2A.

As shown with the enlarged view of FIG. 2B, the PCB 10 includes a conductive layer comprising a connecting pad portion 112 to which the connector 130 is attached, and an adjacent portion to which the connector 130 is not attached. The adjacent portion of the conductive layer is opened via an orifice to form holes 114.

The holes 114 are linearly disposed to be adjacent to a side of the connecting pad portion 112. The connector 130 is attached and fixed to the connecting pad portion 112 while covering up the connecting pad portion 112. In response to stress acting in a direction substantially perpendicular to both a direction of insertion of a socket 142 into the connector 130 and a surface of the bottom chassis 94 because of such structure of the PCB 10, the connecting pad portion 112 attached to the connector 130 may be prevented from being exfoliated. An exfoliation-preventing structure will be explained in greater detail below.

Figure 3:
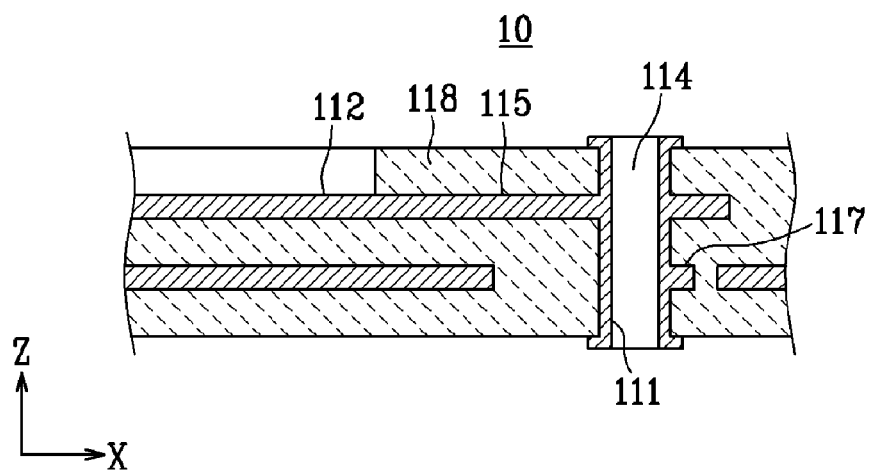
FIG. 3 is a cross-sectional view taken along line A-A of FIG. 2.

FIG. 3 is a cross-sectional view taken along line A-A of FIG. 2B, and shows an inner sectional view of the PCB 10 in which a conductive layer 115 and insulating layers 118 are formed in turn. The conductive layer 115 may be formed of copper or another conductive material, and the PCB 10 may be a copper clad laminate (CCL).

As shown in FIG. 3, the PCB 10 according to an exemplary embodiment of the present invention has a second-floor configuration on which two conductive layers are formed, and the conductive layer 115 and the insulating layer 118 are alternately disposed, thereby applying voltage to driving elements without a short circuit. In particular, as a plurality of elements are mounted on the PCB 10 to improve performance of the LCD device 100, it is desirable that the PCB 10 should have a multi-layered structure. A structure of the PCB 10 shown in FIG. 3 is to only illustrate an exemplary embodiment of the present invention, and the present invention is not limited thereto. Accordingly, the present invention can also be applied to a PCB having another structure.

As shown in FIG. 3, in order to connect the conductive layer 115 for wiring to the connector 130, a part of the conductive layer 115 is exposed on a top surface of the PCB 10 in order to form the connecting pad portion 112. In addition, the conductive layer 115 is manufactured to include the holes 114, such that the holes 114 are adjacent to the connecting pad portion 112. The connector 130 is soldered on the connecting pad portion 112 to be in electrical contact with the conductive layer 115.

In this exemplary embodiment of the present invention, the conductive layer 115 and the insulating layer 118 which is positioned to be adjacent to the connecting pad portion 112 each contain an opened portion or orifice to form the holes 114. The holes 114 extend substantially perpendicular to a surface of the PCB 10. A surface of the holes 114 is coated with a supporting member 111, which is connected to the conductive layer 115. Since a process of manufacturing the PCB 10 having such construction is easily understood by those skilled in the art, a detailed explanation thereof is omitted.

The supporting member 111 is, for example, made of a same material as the conductive layer 115. In other words, if the conductive layer 115 is made of a copper film, the supporting member 111 may be made of the copper film. As a result, the holes 114 may be used to establish an electrical connection to another terminal and costs can be decreased.

In the PCB 10 according to an exemplary embodiment of the present invention as described above, even though stress acts on a top surface of the connecting pad portion 112 in the direction substantially perpendicular to both the direction of insertion of the socket 142 into the connector 130 and the surface of the bottom chassis 94, the connector 130 is not easily exfoliated and thus, the connector 130 is exfoliation resistant. As shown in FIG. 3, a reason for the exfoliation resistant characteristic of the connector 130 is that the conductive layer 115 on which the connecting pad portion 112 is formed is embedded in the PCB 10 and the supporting member 111 is connected to the conductive layer 115. The supporting member 111 extends along a z-axis that is substantially perpendicular to the x-axis and the surface of the bottom chassis 94 to fixedly support the connecting pad portion 112 such that it is not exfoliated. Specifically, in this exemplary embodiment of the present invention, since other elements which may conflict are not mounted on the top surface and a bottom surface of the PCB 10, the holes 114 are formed by penetrating the PCB 10 in order to fixedly support the connecting pad portion 112.

Additionally, at a surface of each of the holes 114, a part of the supporting member 111 extends beyond the top and bottom surfaces of the PCB 10 and overlaps a portion of the top and bottom surfaces of the PCB 10 to support the conductive layer 115. Therefore, the connecting pad portion 112 may be prevented from being exfoliated.

FIG. 3 also shows a protruding portion 117 of the supporting member 111. The protruding portion 117 extends from the supporting member 111 in a direction substantially parallel to both the top and bottom surfaces of the PCB 10 to anchor the supporting member 111 within the PCB 10. Thus, the supporting member 111 is strongly fixed in the PCB 10 by forming the protruding portion 117, and thereby the connecting pad 112 is firmly fixed and exfoliation can be prevented.

Hereinafter, a PCB according alternative exemplary embodiments of the present invention, which have cross-sectional views similar to that of the PCB 10 according to the exemplary embodiment described with reference to FIGS. 1 to 3, will be explained.

Figure 4:
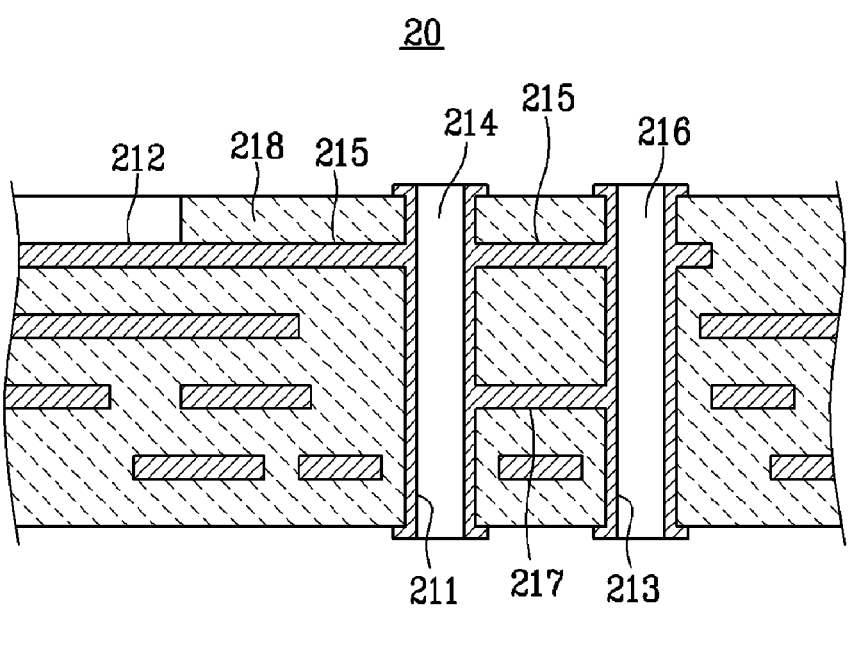
FIG. 4 is a cross-sectional view of a PCB according to an exemplary embodiment of the present invention.

FIG. 4 is a cross-sectional view of a PCB 20 according to an exemplary embodiment of the present invention. The PCB 20 has a fourth-floor configuration such that four conductive layers are alternately deposited between an insulating layer 218. Like the exemplary embodiment referred to with reference to FIG. 3, the PCB 20 shown in FIG. 4 can also be applied to the display device of FIG. 2A by forming a plurality of holes.

As shown in FIG. 4, a first hole 214 and a second hole 216 are formed in the PCB 20. A first supporting member 211 covers a surface of the first hole 214 and a second supporting member 213 covers a surface of the second hole 216. The first supporting member 211 and the second supporting member 213 are connected to each other by a conductor layer 215. Moreover, the first supporting member 211 and the second supporting member 213 are connected to each other with a connecting member 217 disposed inside the PCB 20, such that a combining structure of the PCB 20 becomes much stronger.

As described above, in the PCB 20 according to this exemplary embodiment of the present invention, since two or more holes are formed and supported by the first and second supporting members 211 and 213, and the insulating layer 218 is deposited to be adjacent to the conductive layer 215, if stress affects a connecting pad portion 212 formed by exposing a part of the conductive layer 215 a supporting force of the first supporting member 211 and the second supporting member 213 that are vertically fixed prevent the connecting pad portion 212 from being exfoliated.

Figure 5:
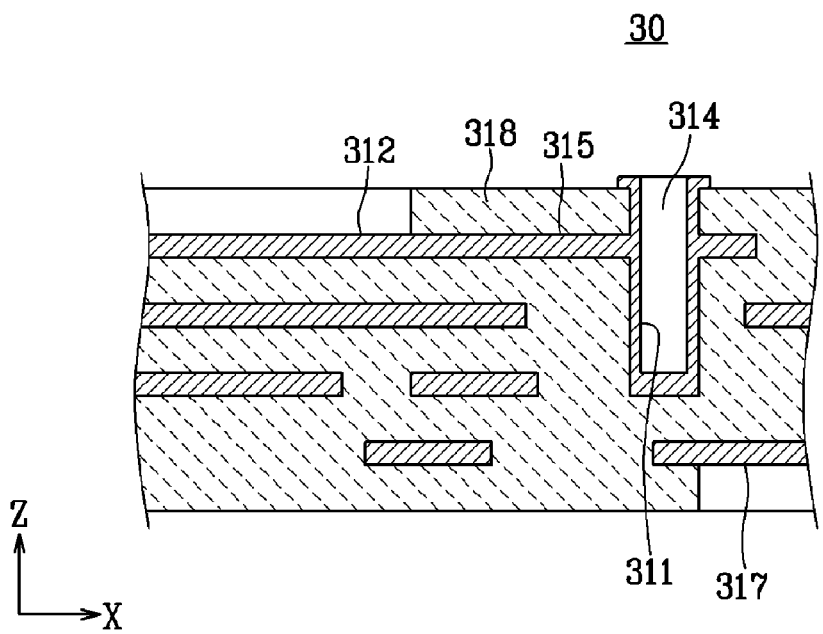
FIG. 5 is a cross-sectional view of a PCB according to another exemplary embodiment of the present invention.

FIG. 5 is a cross-sectional view of a PCB 30 according to another exemplary embodiment of the present invention. The PCB 30 has a fourth-floor configuration such that four conductive layers are alternately disposed between an insulating layer 318. Like the exemplary embodiment described with reference to FIG. 3, the PCB 30 shown in FIG. 5 is also applied to the LCD device 100 of FIGS. 1 and 2A.

As shown in FIG. 5, a hole 314 is formed to have an opening or orifice only at a top surface of the PCB 30, and a surface of the hole 314 is coated with a supporting member 311. In FIG. 5, the insulating layer 318 is deposited on a first conductive layer 315 and a second conductive layer 317 is embedded in a part of the insulating layer 318 positioned below the hole 314. If the hole 314 is opened to a bottom surface of the PCB 30, there is a danger of a short circuit between the supporting member 311 and the second conductive layer 317.

Therefore, in this exemplary embodiment of the present invention, the hole 314 is formed to have an opening toward only the top surface of the PCB 30. In such a configuration, since the supporting member 311, with which a surface of the hole 314 is coated along the z-axis direction, supports the conductive layer 315 in the PCB 30, although an upward pulling stress works on a connecting pad portion 312, the connecting pad portion 312 is strongly fixed so that exfoliation thereof is prevented.

Figure 6:
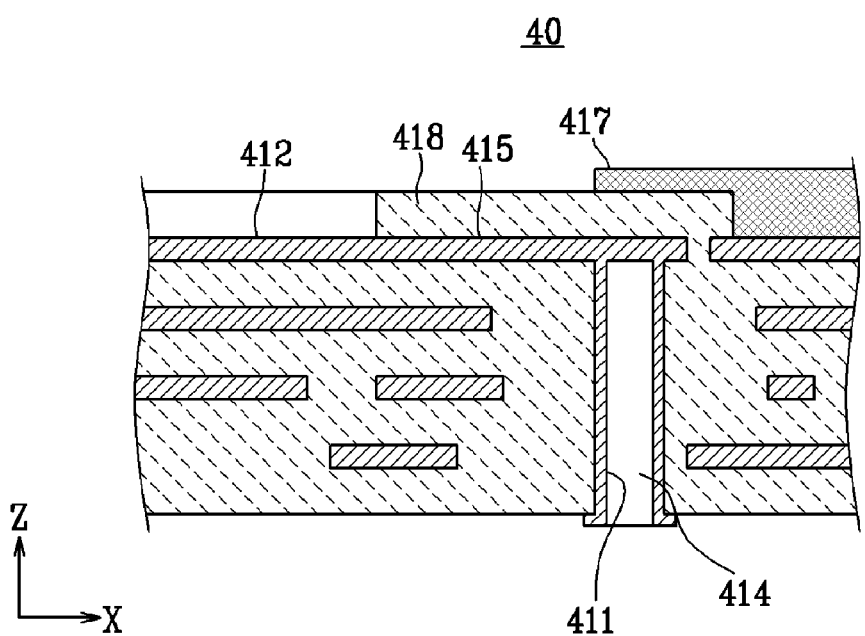
FIG. 6 is a cross-sectional view of a PCB according to yet another exemplary embodiment of the present invention.

FIG. 6 is a cross-sectional view of a PCB 40 according to yet another exemplary embodiment of the present invention. The PCB 40 has a fourth-floor configuration such that four conductive layers are alternately deposited between an insulating layer 418. Like the exemplary embodiment described above with reference to FIG. 3, the PCB 40 shown in FIG. 6 is also applied to the LCD device 100 of FIGS. 1 and 2A.

As shown in FIG. 6, in the PCB 40 according to this exemplary embodiment of the present invention, a hole 414 is formed to have an opening toward only a bottom surface of the PCB 40, and a surface of the hole 414 is coated with a supporting member 411 along the z-axis. The insulating layer 418 is deposited on a conductive layer 415, and an external element 417 is mounted on the insulating layer 418 and above the hole 414. Thus, the external element 417 and the hole 414 are insulated from each other since, if the hole 414 is opened to an upper surface of the PCB 40, there is a danger of a short circuit between the supporting member 414 and the external element 417.

Accordingly, in this exemplary embodiment of the present invention, the hole 414 is opened toward only the bottom surface of the PCB 40. In such a configuration, since the supporting member 411 coating the surface of the hole 414 supports the conductive layer 415 in the PCB 30, although stress acts on a connecting pad portion 412 in the z-axis direction, the connecting pad portion 412 is strongly fixed within the PCB 40 so that exfoliation thereof is prevented.

As described above with reference to FIGS. 1-6, according to the exemplary embodiments of the present invention, a PCB of the present invention can be changed into various configurations, thereby preventing the exfoliation of a connecting pad formed on the PCB.

Figure 7A:
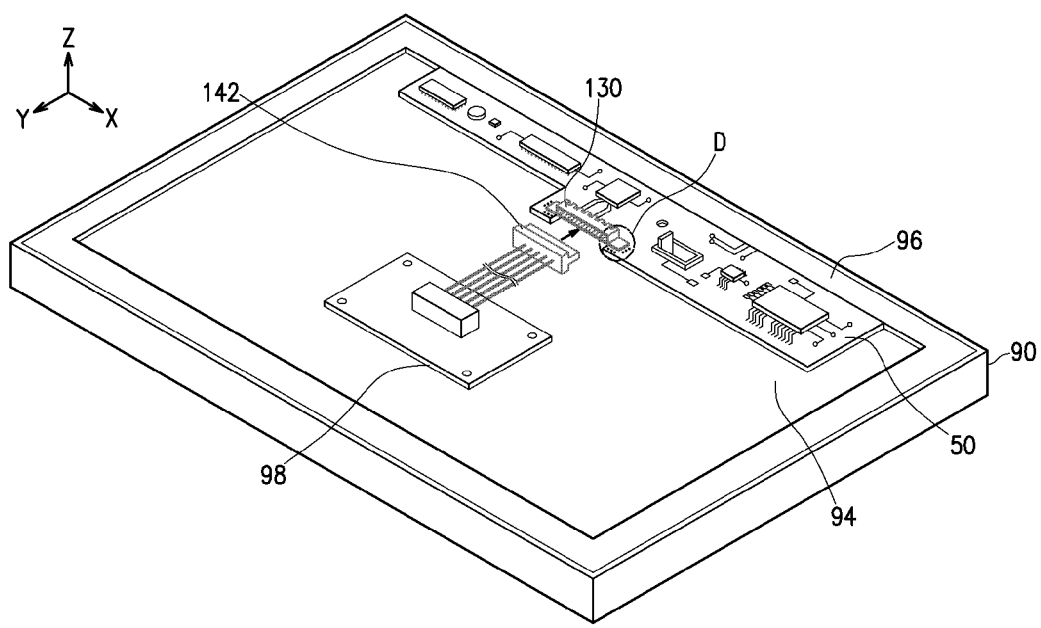
FIG. 7A is a rear perspective view of a display device having a PCB according to still another exemplary embodiment of the present invention.
Figure 7B:
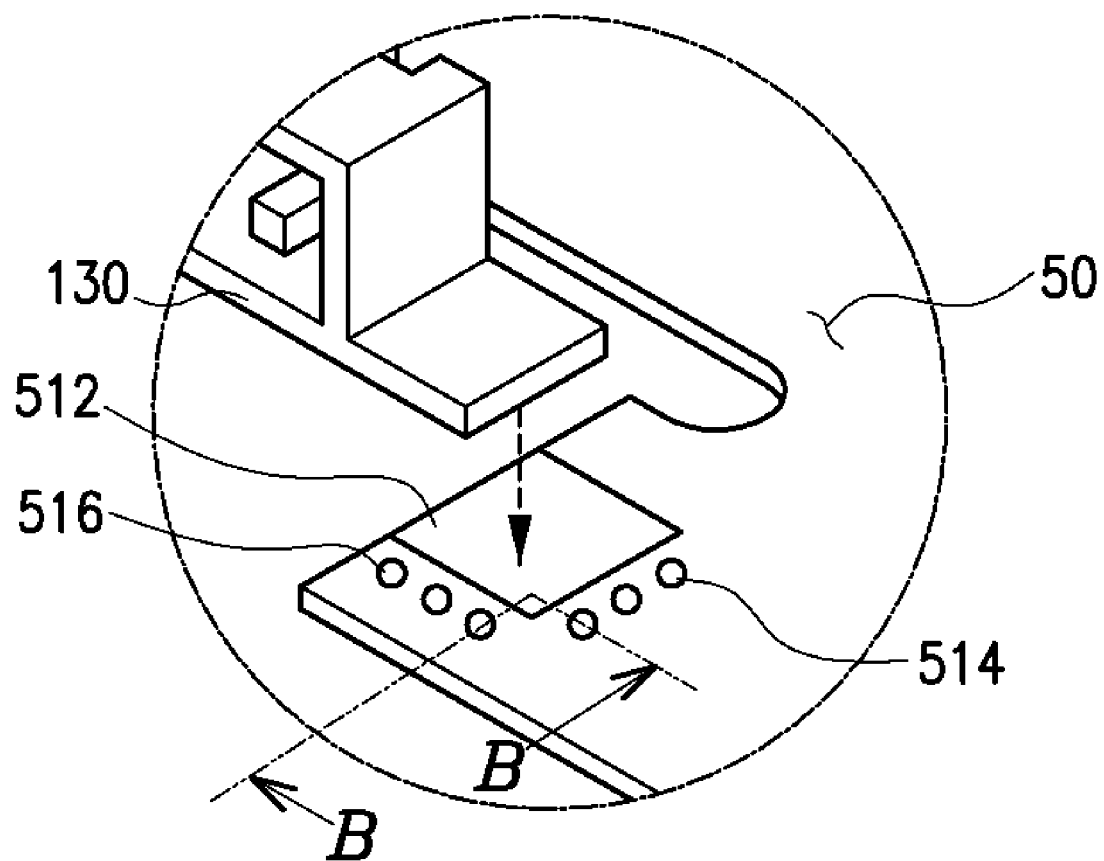
FIG. 7B is an enlarged rear perspective view of portion "D" in FIG. 7A.

FIG. 7A is a rear perspective view of a display device having a PCB 50 according to yet another exemplary embodiment of the present invention. FIG. 7B is an enlarged rear perspective view of part "D" in FIG. 7A. As shown in FIGS. 7A and 7B, first holes 514 and second holes 516 are formed to be adjacent to respective ones of two sides of a connecting pad portion 512. The two sides of the connecting pad portion 512 are continuously connected to each other, and the first and second holes 514 and 516 may be formed to have different configurations.

As shown in the enlarged view of FIG. 7B, a conductive layer in which the connecting pad portion 512 is formed is embedded in the PCB 50. The first holes 514 are linearly disposed along a y-axis direction that is substantially perpendicular to the x-axis direction and the z-axis direction of the LCD device, and the second holes 516 are linearly disposed along the x-axis direction of the connecting pad portion 512. Hereinafter, an inner structure of the conductive layer described above will be explained in more detail with reference to FIG. 8.

Figure 8:
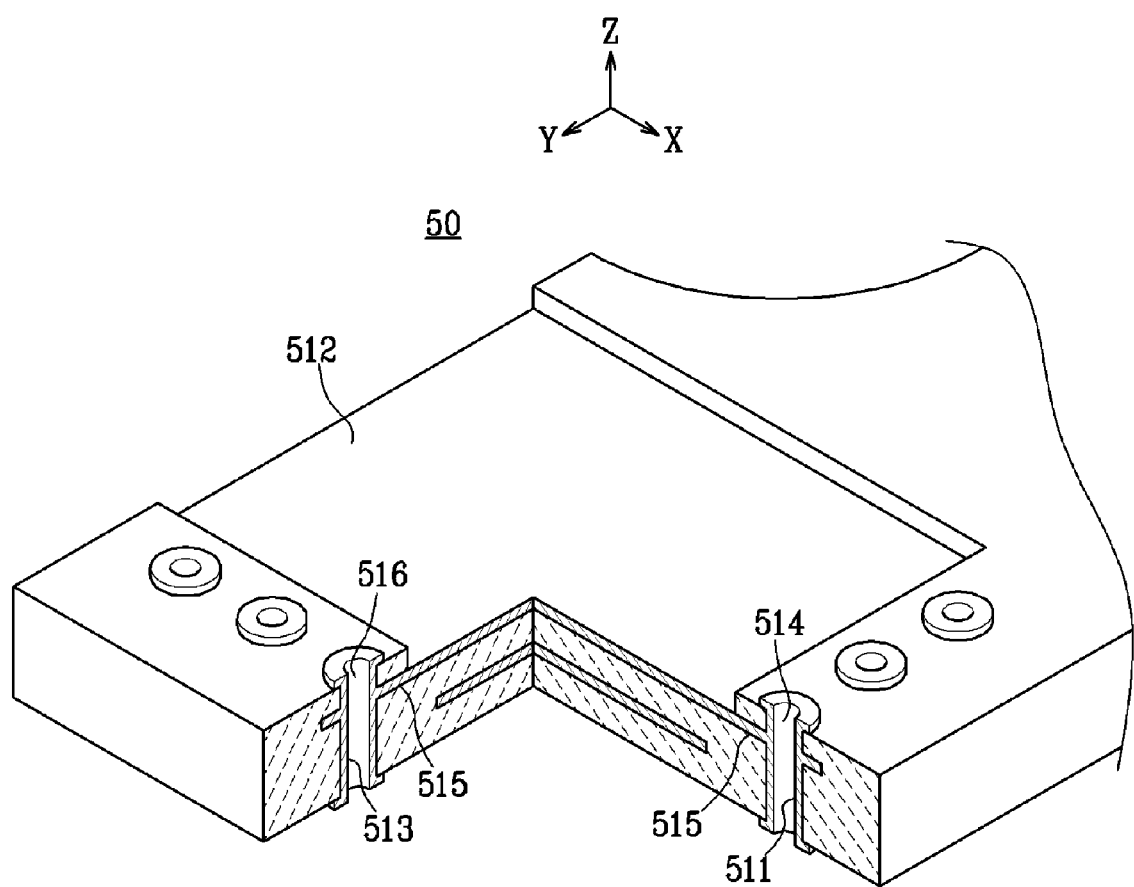
FIG. 8 is a three-dimensional cross-sectional view taken along line B-B of FIG. 7.

FIG. 8 is a three-dimensional cross-sectional view taken along line B-B of FIG. 7B, and shows a three-dimensional cross-section of the PCB 50 according to an exemplary embodiment of the present invention where a conductive layer 515 is embedded and is supported by first supporting members 511 of the first holes 514 and second supporting members 513 of the second holes 516.

As shown in FIG. 8, the conductive layer 515 is widely formed so that the first holes 514 and the second holes 516 are linearly disposed to be adjacent to respective ones of the two sides of the connecting pad portion 512. Surfaces of the first and second holes 514 and 516 are coated with the first supporting member 511 and a second supporting member 513, respectively. The first supporting member 511 and the second supporting member 513 are connected to each other via the conductive layer 515 to support the connecting pad portion 512. As a result, since the connecting pad portion 512 is fixed by the first supporting member 511 and the second supporting member 513 in two directions, if stress works on the connecting pad 512 in the z-axis direction, exfoliation of the connecting pad 512 is effectively prevented.

As described above, with reference to exemplary embodiments of the present invention, exfoliation of a connecting pad portion which is connected to a connector mounted on a PCB can be effectively prevented. Thus, poor-quality rates of display devices can be remarkably reduced. Exfoliation resistance improvement of such connecting pad portions becomes clearer through experimental examples of the present invention as described below.

Hereinafter, the present invention will be described in greater detail through experimental examples of the present invention. Such examples of the present invention are to only illustrate the present invention, and are not limiting.

EXPERIMENTAL EXAMPLES

Exfoliation intensity of both ends of a connector soldered to a connecting pad portion of a PCB is measured using a push-pull gauge (product by AIKOH Engineering; Model No. 1605 HTP). The push-pull gauge used in the present invention can measure exfoliation intensity in a range of about 0 to 50 kgf, and a speed thereof can be varied in a range of about 1 to 200 mm/min. Since exfoliation occurs when both ends of the connector are continuously pulled with increasing force, the exfoliation intensity is measured by calculating a peak value at a moment of exfoliation. Such a method for measuring exfoliation intensity is easily understood by those skilled in the art of the present invention, and thus a detailed explanation thereof is omitted.

EXPERIMENTAL EXAMPLES OF THE PRESENT INVENTION

In the present invention, like the PCB according to the exemplary embodiment of the present invention shown in FIG. 3, an experiment is executed by using a connector soldered to a connecting pad portion. A plurality of holes are formed to be adjacent to the connecting pad portion. Using a total of five PCB samples having a same configuration, push-pull gauges are fixed to both ends of the connector and then pulled. Then, when the connector is exfoliated from the PCB, the exfoliation intensity is measured at left and right ends of the connector and an average thereof is calculated. Left and right exfoliation intensities of each PCB sample and the average thereof are illustrated in Table 1.

COMPARATIVE EXAMPLES OF THE PRIOR ART

Figure 9:
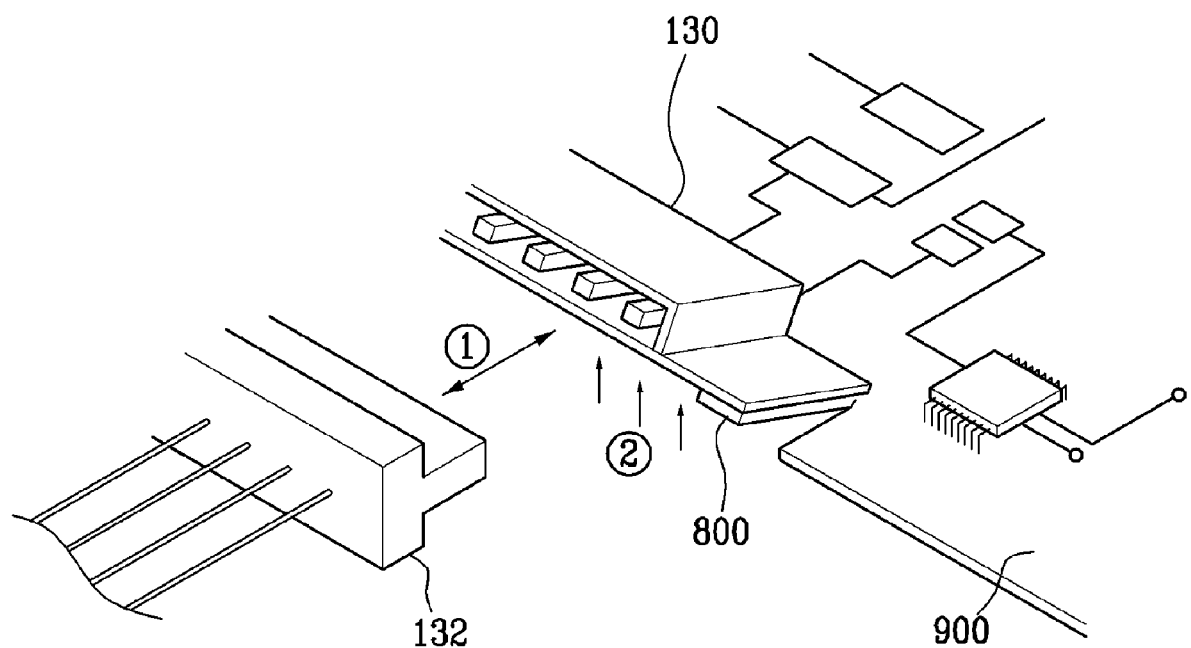
FIG. 9 is a schematic diagram illustrating connection of a conventional PCB.

In conventional connectors, as shown in FIG. 9, an experiment is executed using a conventional connector soldered to a connecting pad portion without holes. Using a total of five PCB samples having a same configuration, push-pull gauges are fixed to both ends of the conventional connector and then pulled. Then, when the conventional connector is exfoliated from the PCB, an exfoliation intensity is measured at the left and right ends of the conventional connector and then an average thereof is calculated. Left and right exfoliation intensities of each PCB sample and the average thereof are illustrated in Table 1.

TABLE 1

|  | Experimental Examples | | Comparative Examples | |
| --- | --- | --- | --- | --- |
|  | Left connecting pad portion | Right connecting pad portion | Left connecting pad portion | Right connecting pad portion |
| Fist sample | 17.1 kgf | 17.8 kgf | 12.5 kgf | 12.0 kgf |
| Second sample | 18.1 kgf | 18.2 kgf | 12.6 kgf | 12.8 kgf |
| Third sample | 17.5 kgf | 17.6 kgf | 13.0 kgf | 12.9 kgf |
| Fourth sample | 17.2 kgf | 17.9 kgf | 12.5 kgf | 12.5 kgf |
| Fifth sample | 18.1 kgf | 17.7 kgf | 12.6 kgf | 12.8 kgf |
| Average | 17.6 kgf | 17.8 kgf | 12.6 kgf | 12.6 kgf |

As illustrated in Table 1, in the experimental examples of the present invention, the average exfoliation intensities of the left and right connecting pad portion are 17.6 kgf and 17.8 kgf, respectively. As compared with the experimental examples, in the comparative examples of the prior art, the average exfoliation intensities of the left and right connecting pad are each 12.6 kgf. Thus, compared with a range of about 12.0 to about 13.0 kgf of the exfoliation intensity of the connecting pad of the comparative examples of the prior art, the exfoliation intensity of the connecting pad of the experimental examples of the present invention is in a range of about 17.0 to about 18.0 kgf which is much higher than the prior art.

Comparing the experimental examples of the present invention with the comparative examples of the prior art regarding the average of exfoliation intensity, the exfoliation intensity of the left connecting pad is determined to be increased by about 40%, and the exfoliation intensity of the right connecting pad is determined to be increased by about 41%. Accordingly, it is understood that exfoliation intensity of the connecting pad portion embedded in the PCB of the present invention is improved relative to that of the connecting pad portion of the prior art. Thus, a PCB with enhanced exfoliation resistance and a display device having the same can be implemented.

While exemplary embodiments of the present invention has been described above, it will be understood by those skilled in the art that various changes and modifications may be made therein without departing from the spirit and scope of the invention as defined by the appended claims.

What is claimed is:

1. A display device comprising:
a display panel on which images are displayed; and
a printed circuit board connected to the display panel,
wherein the printed circuit board receives a driving signal from a control board through a connector mounted on the printed circuit board,
the printed circuit board comprising:
a first hole which is an open orifice through a first thickness of the printed circuit board;
a conductive layer, wherein the conductive layer comprises:
a connecting pad portion to which the connector is attached and adjacent to the first hole,
a first supporting member which is continuous with the connecting pad portion and covers a surface of the first hole, and
an adjacent portion to which the connector is not attached, and
an insulating layer which exposes the connecting pad portion, wherein the first supporting member penetrates the insulating layer.

2. The display device of claim 1, wherein the connector covers the connecting pad portion and is fixed to the connecting pad portion.

3. The display device of claim 1, wherein the display panel is a liquid crystal display panel.

4. The display device of claim 1, wherein the first supporting member is continuously extended to a surface of the printed circuit board from the surface of the first hole so that a part of the first supporting member is overlapped with the surface of the printed circuit board.

5. The display device of claim 1, wherein the first hole is opened to only one of a top surface of the printed circuit board and a bottom surface of the printed circuit board.

6. The display device of claim 1, wherein the first hole is formed by penetrating the printed circuit board from a top surface to a bottom surface of the printed circuit board.

7. The display device of claim 1, wherein
the printed circuit board further comprises a second hole which is an open orifice through a second thickness of the printed circuit board,
the conductive layer further comprises a second supporting member which covers a surface of the second hole, and
the first and second holes are adjacent to a first side and a second side of the connecting pad portion, respectively, the first and second sides being continuously connected to each other.

8. The display device of claim 1, wherein
the printed circuit board further comprises a plurality of first holes,
the conductive layer further comprises a corresponding plurality of first supporting members, and
the plurality of first holes are in linearly arrangement and adjacent to a side of the connecting pad portion.

9. The display device of claim 1, wherein
the printed circuit board further comprises a second hole which is an open orifice through a second thickness of the printed circuit board, and
the conductive layer further comprises:
a second supporting member which covers a surface of the second hole, and
a connecting member at an interior portion of the printed circuit board, wherein the connecting member connects the first and second supporting members to each other.

10. The display device of claim 1, wherein the first supporting member has a protruding portion extending substantially perpendicular to the surface of the first hole and substantially parallel to a surface of the printed circuit board.

* * * * *